(12) United States Patent
Wang et al.

(10) Patent No.: US 11,967,517 B2
(45) Date of Patent: Apr. 23, 2024

(54) ELECTROSTATIC CHUCK WITH CERAMIC MONOLITHIC BODY

(71) Applicant: LAM RESEARCH CORPORATION, Fremont, CA (US)

(72) Inventors: Feng Wang, Sunnyvale, CA (US); Keith Gaff, Fremont, CA (US); Christopher Kimball, San Jose, CA (US); Darrell Ehrlich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 335 days.

(21) Appl. No.: 17/429,434

(22) PCT Filed: Jan. 27, 2020

(86) PCT No.: PCT/US2020/015148
§ 371 (c)(1),
(2) Date: Aug. 9, 2021

(87) PCT Pub. No.: WO2020/167451
PCT Pub. Date: Aug. 20, 2020

(65) Prior Publication Data
US 2022/0148903 A1    May 12, 2022

Related U.S. Application Data

(60) Provisional application No. 62/804,465, filed on Feb. 12, 2019.

(51) Int. Cl.
*H01T 23/00* (2006.01)
*C04B 37/00* (2006.01)
(Continued)

(52) U.S. Cl.
CPC ........ *H01L 21/6833* (2013.01); *C04B 37/001* (2013.01); *C04B 41/009* (2013.01);
(Continued)

(58) Field of Classification Search
None
See application file for complete search history.

(56) References Cited

U.S. PATENT DOCUMENTS

| 4,859,520 A | 8/1989 | Dubuisson et al. |
| 5,535,090 A * | 7/1996 | Sherman ............. H01L 21/6833 279/128 |

(Continued)

FOREIGN PATENT DOCUMENTS

| CN | 107004626 A | 8/2017 |
| JP | 2001118915 A | 4/2001 |

(Continued)

OTHER PUBLICATIONS

International Search Report and Written Opinion for PCT/US2019/018190 filed Feb. 15, 2019; 10 pages.

(Continued)

*Primary Examiner* — Stephen W Jackson

(57) ABSTRACT

An electrostatic chuck for a substrate processing system includes a monolithic body made of ceramic. A plurality of first electrodes are arranged in the monolithic body adjacent to a top surface of the monolithic body and that are configured to selectively receive a chucking signal. A gas channel is formed in the monolithic body and is configured to supply back side gas to the top surface. Coolant channels are formed in the monolithic body and are configured to receive fluid to control a temperature of the monolithic body.

18 Claims, 9 Drawing Sheets

(51) Int. Cl.
*C04B 41/00* (2006.01)
*C04B 41/45* (2006.01)
*H01J 37/32* (2006.01)
*H01L 21/683* (2006.01)

(52) U.S. Cl.
CPC .... *C04B 41/4531* (2013.01); *H01J 37/32715* (2013.01); *H01J 37/32091* (2013.01); *H01J 2237/2007* (2013.01)

(56) References Cited

U.S. PATENT DOCUMENTS

| | | | |
|---|---|---|---|
| 5,701,228 A | 12/1997 | Ishii | |
| 6,529,362 B2* | 3/2003 | Herchen | H01L 21/6831 361/234 |
| 10,347,521 B2 | 7/2019 | Ishikawa et al. | |
| 2002/0018696 A1 | 2/2002 | Robinson | |
| 2002/0186967 A1 | 12/2002 | Ramanan et al. | |
| 2003/0161088 A1* | 8/2003 | Migita | H01L 21/6831 361/234 |
| 2004/0015454 A1 | 1/2004 | Raines et al. | |
| 2004/0019205 A1 | 1/2004 | Bosch et al. | |
| 2004/0154540 A1 | 8/2004 | Hayami et al. | |
| 2004/0192053 A1 | 9/2004 | Fujimoto | |
| 2005/0011845 A1 | 1/2005 | Ernst et al. | |
| 2005/0118450 A1 | 6/2005 | Fujii et al. | |
| 2006/0028527 A1 | 2/2006 | Kaga et al. | |
| 2006/0076109 A1 | 4/2006 | Holland et al. | |
| 2006/0285270 A1 | 12/2006 | Lee | |
| 2007/0258186 A1* | 11/2007 | Matyushkin | H01L 21/6875 361/234 |
| 2009/0002913 A1* | 1/2009 | Naim | H01L 21/67109 279/128 |
| 2009/0007193 A1 | 1/2009 | Correa et al. | |
| 2009/0071938 A1 | 3/2009 | Dhindsa et al. | |
| 2010/0078129 A1 | 4/2010 | Himori et al. | |
| 2011/0096461 A1 | 4/2011 | Yoshikawa et al. | |
| 2011/0154843 A1 | 6/2011 | Ko et al. | |
| 2013/0244405 A1 | 9/2013 | Terahara et al. | |
| 2013/0286533 A1 | 10/2013 | Takasaki et al. | |
| 2014/0020238 A1 | 1/2014 | Yuhara et al. | |
| 2014/0069584 A1 | 3/2014 | Yang et al. | |
| 2014/0159325 A1 | 6/2014 | Parkhe et al. | |
| 2014/0202386 A1 | 7/2014 | Taga et al. | |
| 2014/0202389 A1 | 7/2014 | Heo et al. | |
| 2016/0003561 A1 | 1/2016 | Casper et al. | |
| 2016/0035610 A1 | 2/2016 | Park et al. | |
| 2016/0111314 A1 | 4/2016 | Kimball et al. | |
| 2016/0126125 A1 | 5/2016 | Okugawa et al. | |
| 2017/0032935 A1 | 2/2017 | Benjamin et al. | |
| 2017/0110356 A1 | 4/2017 | Matyushkin et al. | |
| 2017/0200588 A1 | 7/2017 | Joubert et al. | |
| 2017/0256431 A1 | 9/2017 | Parkhe | |
| 2018/0012784 A1 | 1/2018 | Eto | |
| 2018/0019148 A1 | 1/2018 | Cox | |
| 2019/0088517 A1 | 3/2019 | Kosakai et al. | |
| 2020/0194240 A1 | 6/2020 | Sasaki et al. | |

FOREIGN PATENT DOCUMENTS

| | | |
|---|---|---|
| JP | 2003208966 A | 7/2003 |
| JP | 2005012143 A | 1/2005 |
| JP | 2005-33181 A | 2/2005 |
| JP | 2006140455 A | 6/2006 |
| JP | 3887842 B2 | 2/2007 |
| JP | 2007266342 A | 10/2007 |
| JP | 2010114351 A | 5/2010 |
| JP | 2011119654 A | 6/2011 |
| JP | 2013191802 A | 9/2013 |
| JP | 2014160790 A | 9/2014 |
| JP | 5714119 B2 | 5/2015 |
| JP | 2015159232 A | 9/2015 |
| JP | 2015226010 A | 12/2015 |
| JP | 2016503962 A | 2/2016 |
| JP | 2017076580 A | 4/2017 |
| JP | 2017208565 A | 11/2017 |
| JP | 2018026331 A | 2/2018 |
| JP | 2019117928 A | 7/2019 |
| KR | 20110014104 A | 2/2011 |
| KR | 20140082830 A | 7/2014 |
| KR | 20140098707 A | 8/2014 |
| KR | 101495850 B1 | 2/2015 |
| KR | 20160145865 A | 12/2016 |
| TW | 201528425 A | 7/2015 |
| TW | 201826316 A | 7/2018 |
| WO | WO-2014084334 A1 | 6/2014 |
| WO | WO-2016080502 A1 | 5/2016 |
| WO | WO-2017151238 A1 | 9/2017 |

OTHER PUBLICATIONS

International Search Report and Written Opinion for PCT Application No. PCT/US2019/046678 dated Dec. 2, 2019; 11 Pages.
Office Action issued in corresponding Japanese Patent Application 2020-544427 dated Feb. 21, 2023.
Office Action issued in corresponding Japanese Patent Application 2020-544427 dated Aug. 15, 2023.
International Search Report and Written Opinion of the ISA issued in PCT/US2020/015148, dated May 27, 2020; ISA/KR.
Office Action issued in corresponding Korean Patent Application 10-2020-7027358 dated Nov. 13, 2023.
Office Action issued in corresponding Taiwanese Patent Application 109104140 dated Oct. 5, 2023.

* cited by examiner

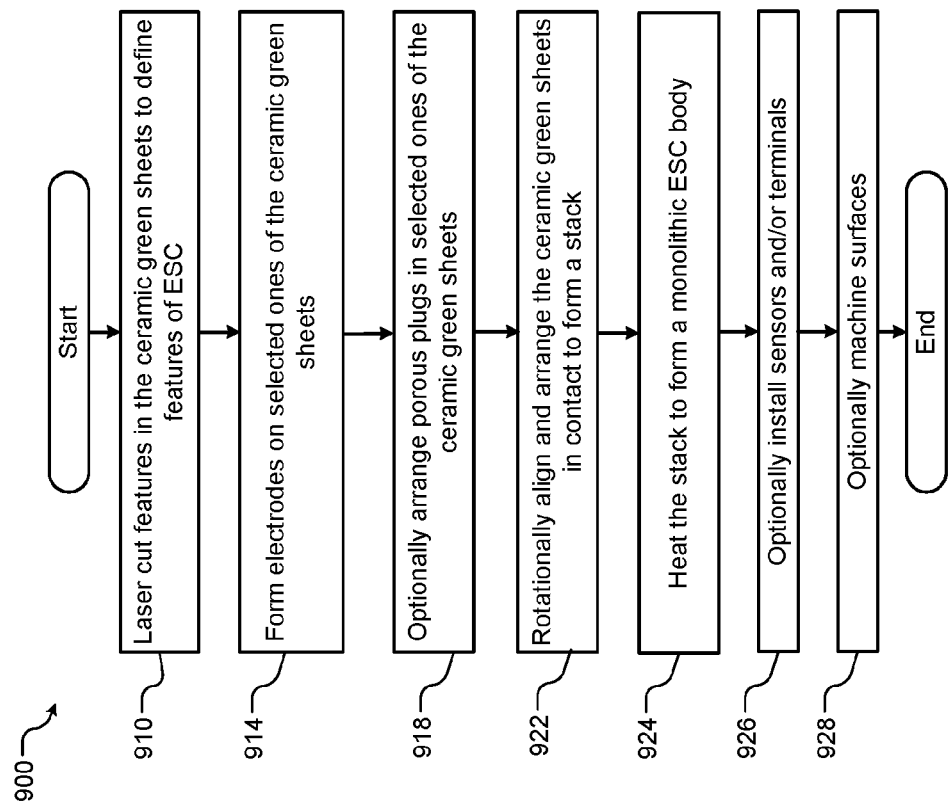
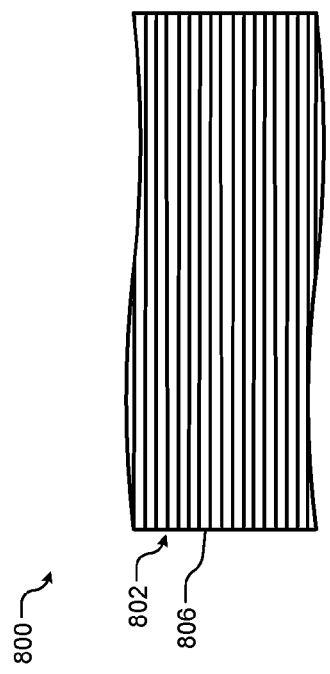
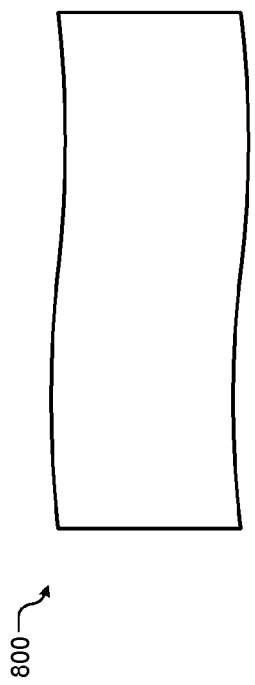

ELECTROSTATIC CHUCK WITH CERAMIC MONOLITHIC BODY

CROSS REFERENCE TO RELATED APPLICATIONS

The present disclosure is a U.S. National Phase Application under 35 U.S.C. 371 of International Application No. PCT/US2020/015148, filed on Jan. 27, 2020, which claims the benefit of U.S. Provisional Application No. 62/804,465, filed on Feb. 12, 2019. The entire disclosures of the applications referenced above are incorporated herein by reference.

FIELD

The present disclosure relates to substrate processing systems, and more particularly to an electrostatic chuck with a ceramic monolithic body for a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to treat substrates, such as semiconductor wafers. Example processes that are performed on a substrate include, but are not limited to, deposition, etching, cleaning, and other types of processes. A substrate is arranged on a substrate support, such as an electrostatic chuck (ESC), in a processing chamber. During processing, gas mixtures are introduced into the processing chamber and plasma may be used to initiate chemical reactions.

SUMMARY

An electrostatic chuck for a substrate processing system includes a monolithic body made of ceramic. A plurality of first electrodes are arranged in the monolithic body adjacent to a top surface of the monolithic body and are configured to selectively receive a chucking signal. A gas channel is formed in the monolithic body and is configured to supply back side gas to the top surface. A plurality of coolant channels are formed in the monolithic body and are configured to receive fluid to control a temperature of the monolithic body.

In other features, the monolithic body comprises a plurality of ceramic green sheets. The monolithic body comprises a first portion arranged adjacent to a substrate and a second portion located adjacent to the first portion. The first portion is made of a plurality of first ceramic green sheets having a first quality and the second portion is made of a plurality of second ceramic green sheets having a second quality that is lower than the first quality.

In other features, the second plurality of ceramic green sheets have at least one of increased porosity, reduced purity, an increased dielectric constant or an increased loss tangent relative to the first ceramic green sheets. The plurality of first electrodes are arranged between the plurality of coolant channels and the top surface. A plurality of second electrodes are arranged in the monolithic body and are configured to receive an RF bias signal. The plurality of second electrodes are arranged between the plurality of coolant channels and the plurality of first electrodes. A porous plug is arranged in at least one of an inlet and an outlet of the gas channel.

In other features, the monolithic body comprises a first portion arranged adjacent to a substrate and a second portion arranged adjacent to the first portion. The second portion is made of a plurality of ceramic green sheets. The first portion is deposited on the second portion and includes a plurality of ceramic layers and a conducting layer defining the plurality of first electrodes.

In other features, the first portion is deposited using a process selected from a group consisting of atomic layer deposition and chemical vapor deposition. The monolithic body defines a lift pin cavity and further includes a lift pin assembly arranged in the lift pin cavity.

A method for fabricating a monolithic electrostatic chuck includes selecting a plurality of ceramic green sheets for the monolithic electrostatic chuck; cutting a plurality of features in first selected ones of the plurality of ceramic green sheets, wherein the plurality of features are selected from a group consisting of a gas channel, a coolant channel, and a lift pin cavity; forming a plurality of electrodes on second selected ones of the plurality of ceramic green sheets; aligning and arranging the plurality of ceramic green sheets in a stack; and heating the stack to a predetermined temperature to form the monolithic electrostatic chuck.

In other features, the predetermined temperature is in a range from 1000° C. to 2000° C. The plurality of features include the coolant channel and the coolant channel extends through adjacent ones of the plurality of ceramic green sheets. The plurality of features include the gas channel and the gas channel extends through adjacent ones of the plurality of ceramic green sheets. The method includes arranging a porous plug material in at least one of an inlet and an outlet of the gas channel prior to heating the stack.

In other features, the method includes machining at least one surface of the monolithic electrostatic chuck after heating the stack. The method includes forming a plurality of electrodes on selected ones of the plurality of ceramic green sheets prior to heating.

A method for fabricating a monolithic electrostatic chuck includes providing U ceramic green sheets having a first quality, where U is an integer greater than one; cutting a plurality of features in selected ones of the U ceramic green sheets; aligning and arranging the U ceramic green sheets in a first stack; providing L ceramic green sheets having a second quality that is lower than the first quality, where L is an integer greater than one; cutting a plurality of features in selected ones of the L ceramic green sheets; aligning and arranging the L ceramic green sheets in a second stack; arranging and aligning the first stack adjacent to the second stack; and heating the first stack and the second stack.

In other features, the first stack and the second stack are heated to a temperature in a range from 1000° C. to 2000° C. The method includes forming a plurality of first electrodes configured to receive a chucking bias on selected ones of the U ceramic green sheets prior to heating the first stack and the second stack.

In other features, the method includes forming a plurality of second electrodes configured to receive an RF bias on selected ones of the U ceramic green sheets prior to heating the first stack and the second stack. The L ceramic green sheets have at least one of increased porosity, reduced purity, an increased dielectric constant or an increased loss tangent relative to the U ceramic green sheets. Cutting the plurality of features includes forming a plurality of coolant channels in at least one of the U ceramic green sheets and the L ceramic green sheets prior to heating the first stack and the second stack. Cutting the plurality of features includes forming a plurality of gas channels in at least one of the U ceramic green sheets and the L ceramic green sheets prior to heating the first stack and the second stack.

In other features, the method includes arranging a porous plug material in at least one of an inlet and an outlet of the plurality of gas channels prior to heating the first stack and the second stack. The method includes machining at least one surface of the first stack after heating the first stack and the second stack.

A method for fabricating a monolithic electrostatic chuck includes selecting a plurality of ceramic green sheets for a lower portion of an electrostatic chuck body; cutting a plurality of features in selected ones of the plurality of ceramic green sheets; aligning and arranging the plurality of ceramic green sheets in a stack; heating the stack to a predetermined temperature; and creating an upper portion of the electrostatic chuck body by depositing a plurality of layers on an upper surface of the stack. The plurality of layers include ceramic and define a plurality of electrodes.

In other features, the predetermined temperature is in a range from 1000° C. to 2000° C. A first quality of ceramic material in the upper portion of the electrostatic chuck body is higher than a second quality of ceramic material in the lower portion of the electrostatic chuck body. The plurality of ceramic green sheets in the lower portion have at least one of increased porosity, reduced purity, an increased dielectric constant or an increased loss tangent relative to the plurality of ceramic green sheets in the upper portion. The plurality of features include coolant channels formed in adjacent ones of the plurality of ceramic green sheets. The plurality of features include gas channels formed in adjacent ones of the ceramic green sheets.

In other features, the method includes arranging a porous plug material in at least one of an inlet and an outlet of the gas channels prior to heating the stack. The method includes machining at least one surface of the lower portion after heating the stack and prior to depositing the upper portion. The depositing the plurality of layers on the upper surface of the stack includes a process selected from a group consisting of atomic layer deposition and chemical vapor deposition. The method includes forming a plurality of electrodes on selected ones of the ceramic green sheets prior to heating.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 8A is a side cross-sectional view of an example of a body stack including ceramic green sheets before heating according to the present disclosure;

FIG. 8B illustrates the body stack of FIG. 8A after heating according to the present disclosure;

FIG. 9 is a flowchart of an example of a method for fabricating the ESC with a monolithic body according to the present disclosure;

In the drawings, reference numbers may be reused to identify similar and/or identical elements.

DETAILED DESCRIPTION

Figure 1:
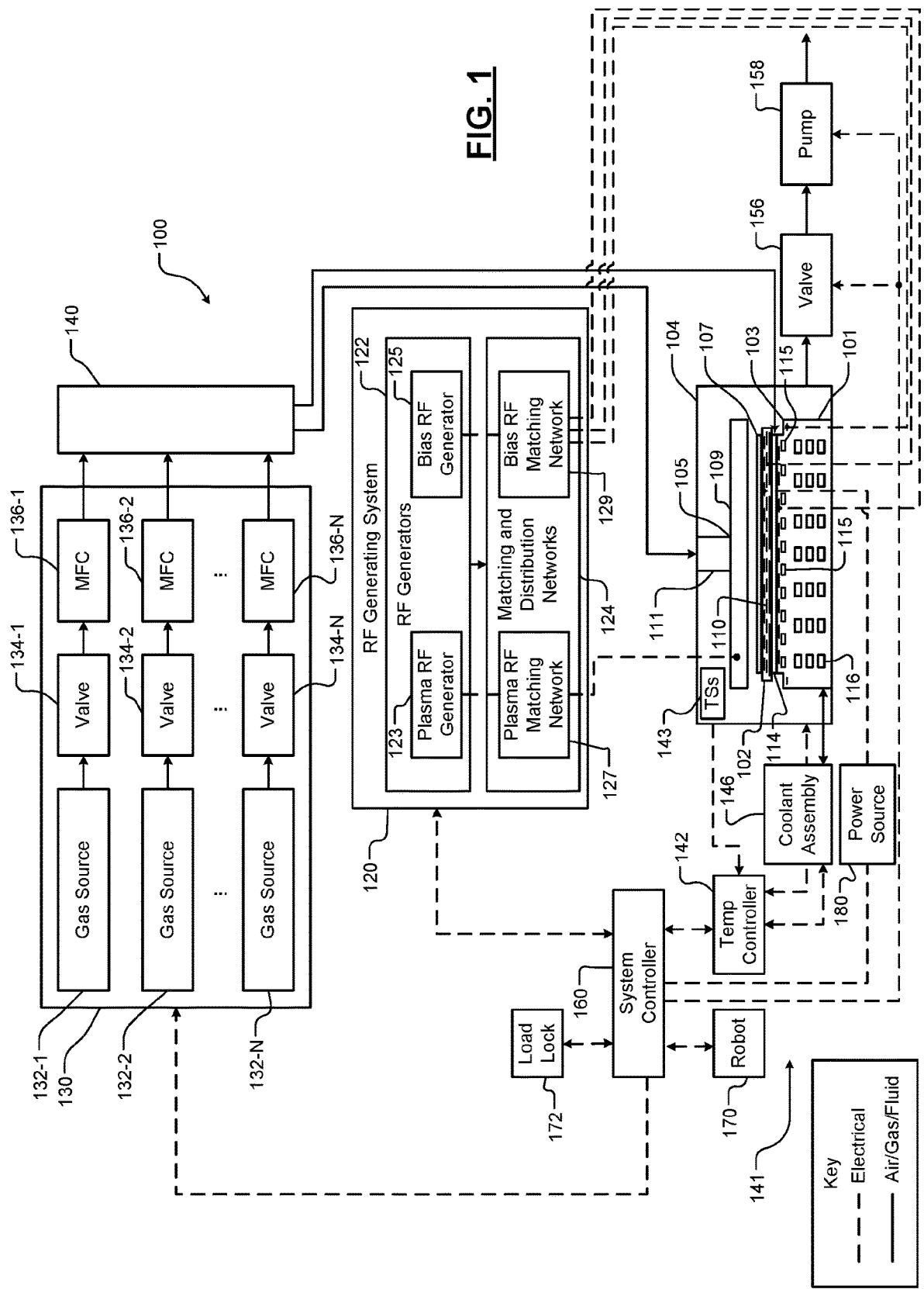
FIG. 1 is a functional block diagram of an example of a substrate processing system incorporating an ESC with a ceramic monolithic body according to the present disclosure.

An ESC typically includes a ceramic plate that is bonded by a bonding layer to a base plate. The baseplate is usually made of metal such as aluminum (Al), titanium ($T_1$), or other metal. The baseplate is often coated with a thin layer of ceramic such as alumina or other coating. The ceramic coating is typically applied using an electro-chemical anodization process, a thermal spraying process or other approach. The ceramic plate and the baseplate are bonded together by the bonding layer. For example only, the bonding layer can include silicon polymers, organic polymer binders, inorganic fillers, and/or soft metal materials. The bonding layer usually requires protection from the plasma processing environment.

There are many disadvantages associated with this design. For example, the ceramic coating tends to break down when exposed to high voltage, which causes electrical arcing in the processing chamber. The baseplate and the ceramic plate also have different CTEs. The mismatched materials expand and contract at different rates as temperature changes. The expansion and contraction causes misalignment and thermal stress. The ceramic coating may also crack due differences in coefficients of thermal expansion (CTE) of the baseplate and the ceramic coating.

The baseplate also serves as a single RF electrode. This fact makes it difficult to apply different RF potentials to different areas of the baseplate.

The bonding layer acts as a thermal barrier, which limits thermal transfer and leads to higher substrate temperatures, especially for high power applications. The bonding layer is subjected to deformation cycles due to the different CTEs of the ceramic plate and the baseplate during processing. Eventually, the deformation cycles cause delamination of the bonding layer and failure of the ESC.

In some examples, the ESC according to the present disclosure is fabricated monolithicly (without using a bonding layer). The ESC includes embedded electrodes for electrostatic chucking, temperature control, RF power delivery, RF shielding, etc. The ESC also includes other integrated components such as temperature sensors, current and/or voltage sensors, porous media gas buffers, embedded gas channels and/or embedded coolant channels.

The ESC according to the present disclosure solves many of the problems encountered when using prior ESC designs. Since the body of the ESC is monolithic and made of ceramic, the ceramic coating is either eliminated or has a similar CTE. Since there is little or no CTE mismatch, cracking of the ceramic coating is eliminated. As a result, the operating temperature range of the ESC can be increased.

Since the baseplate is no longer made of metal, one or more electrodes are embedded in the body of the ESC. The electrodes can be controlled using one or more RF potentials to allow variation in the RF bias at different locations of the substrate.

Since the bonding layer is eliminated, failures caused by erosion of the bonding layer and delamination are eliminated, which improves ESC lifetime and reliability.

Since the body of the ESC is monolithic and made of ceramic, thermal expansion and contraction differences across the ESC are minimized. As a result, thermal mismatch and thermal stress are significantly reduced. Since the bonding layer is eliminated, thermal conduction from the substrate to cooling fluids (such as gases or liquids) in the ESC increases. The improved thermal conduction enables higher power applications since heat transfer with the coolant channels is more efficient.

In some examples, the body of the ESC is made of a material selected from a group consisting of alumina ($Al_2O_3$), aluminum nitride (AlN), silicon carbide (SiC) or other ceramic materials. In some examples, the body of the ESC is coated. In some examples, the coating material is selected from a group consisting of alumina ($Al_2O_3$), yttrium oxide ($Y_2O_3$), or zirconium dioxide ($ZrO_2$).

In some examples, the body of the ESC is made of ceramic materials of different grades or quality at different vertical portions thereof to reduce cost and/or optimize performance. For example, a finer grade of ceramic material may be used at an upper portion of the ESC close to the substrate for improved purity, dielectric, electrical or mechanical properties, etc, and a lower grade of ceramic material is used for lower portions of the ESC.

In some examples, the ESC includes embedded electrodes that are made of a material selected from a group consisting of tungsten (W), platinum (Pt), silver (Ag), palladium (Pd) or other conductive material. The body of the ESC may include one or more electrodes that are connected together or controlled separately. The electrodes may also be arranged in different locations of the body.

Referring now to FIG. 1, a substrate processing system 100 including an electrostatic chuck (ESC) 101 is shown. Although FIG. 1 shows a capacitive coupled plasma (CCP) system, the present application is also applicable to other processes such as transformer coupled plasma (TCP) systems, electron cyclotron resonance (ECR) plasma systems, ion beam etchers (IBE), inductively coupled plasma (ICP) systems, and/or other systems that include a substrate support.

Although the ESC 101 is shown as being mounted to the bottom of the processing chamber, the ESC 101 may be mounted to the top of the processing chamber. If mounted to the top of the processing chamber, the ESC 101 may be flipped upside down and may include peripheral substrate holding, clamping, and/or clasping hardware.

The substrate processing system 100 includes a processing chamber 104. The processing chamber 104 encloses the ESC 101 and other components. The processing chamber 104 also contains radio frequency (RF) plasma. During operation, a substrate 107 is arranged on and electrostatically clamped to the ESC 101.

For example only, a showerhead 109 distributes gases and may serve as an upper electrode 105. The showerhead 109 may include a stem portion 111 including one end connected to a top surface of the processing chamber 104. The showerhead 109 is generally cylindrical and extends radially outward from an opposite end of the stem portion 111 at a location that is spaced from the top surface of the processing chamber 104. A substrate-facing surface of the showerhead 109 includes gas through holes through which process gas flows. Alternately, the upper electrode 105 may include a conducting plate and the gases may be introduced in another manner. Electrodes embedded in the ESC 101 serve as a lower electrode.

The ESC 101 may include one or more gas channels 115 and/or one or more coolant channels 116. The gas channels 115 supply back side gas such as helium (He) or other gas to a back side of the substrate 107. Fluid flows through the coolant channels 116 in the ESC 101 to control a temperature of the ESC 101.

An RF generating system 120 outputs RF voltage to the upper electrode 105 and/or the lower electrode in the ESC 101. One of the upper electrode 105 and the lower electrode may be DC grounded, AC grounded, or at a floating potential. For example only, the RF generating system 120 may include one or more RF generators 122 that generate RF voltages. The output of the RF generator(s) 122 are fed by one or more matching and distribution networks 124 to the upper electrode 105 and/or the lower electrode. As an example, an RF plasma generator 123, an RF bias generator 125, an RF plasma matching network 127, and an RF bias matching network 129 are shown.

A gas delivery system 130 includes one or more gas sources 132-1, 132-2, . . . , and 132-N (collectively gas sources 132), where N is an integer greater than zero. The gas sources 132 supply one or more precursors, etch gases, inert gases, carrier gases, purge gases and gas mixtures thereof. Vaporized precursor may also be used.

The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 104. For example only, the output of the manifold 140 may be fed to the showerhead 109.

The substrate processing system 100 further includes a temperature control system 141 that includes a temperature controller 142. Although shown separately from a system controller 160, the temperature controller 142 may be implemented as part of the system controller 160. The temperature controller 142 controls a temperature and a flowrate of coolant flowing through the coolant channels 116 via a coolant assembly 146. The coolant assembly 146 includes a coolant pump that pumps coolant from a reservoir to the coolant channels 116. The coolant assembly 146 may also include a heat exchanger that transfers heat away from the coolant. The coolant may be, for example, a liquid coolant.

A valve 156 and pump 158 are used to evacuate reactants from the processing chamber 104. A robot 170 delivers substrates onto and remove substrates from the ESC 101. For example, the robot 170 may transfer substrates between the ESC 101 and a load lock 172. The system controller 160 may control operation of the robot 170 and/or the load lock 172. An ESC power supply 180 selectively supplies a clamping signal to cause the electrodes to clamp the substrate 107.

Figure 2:
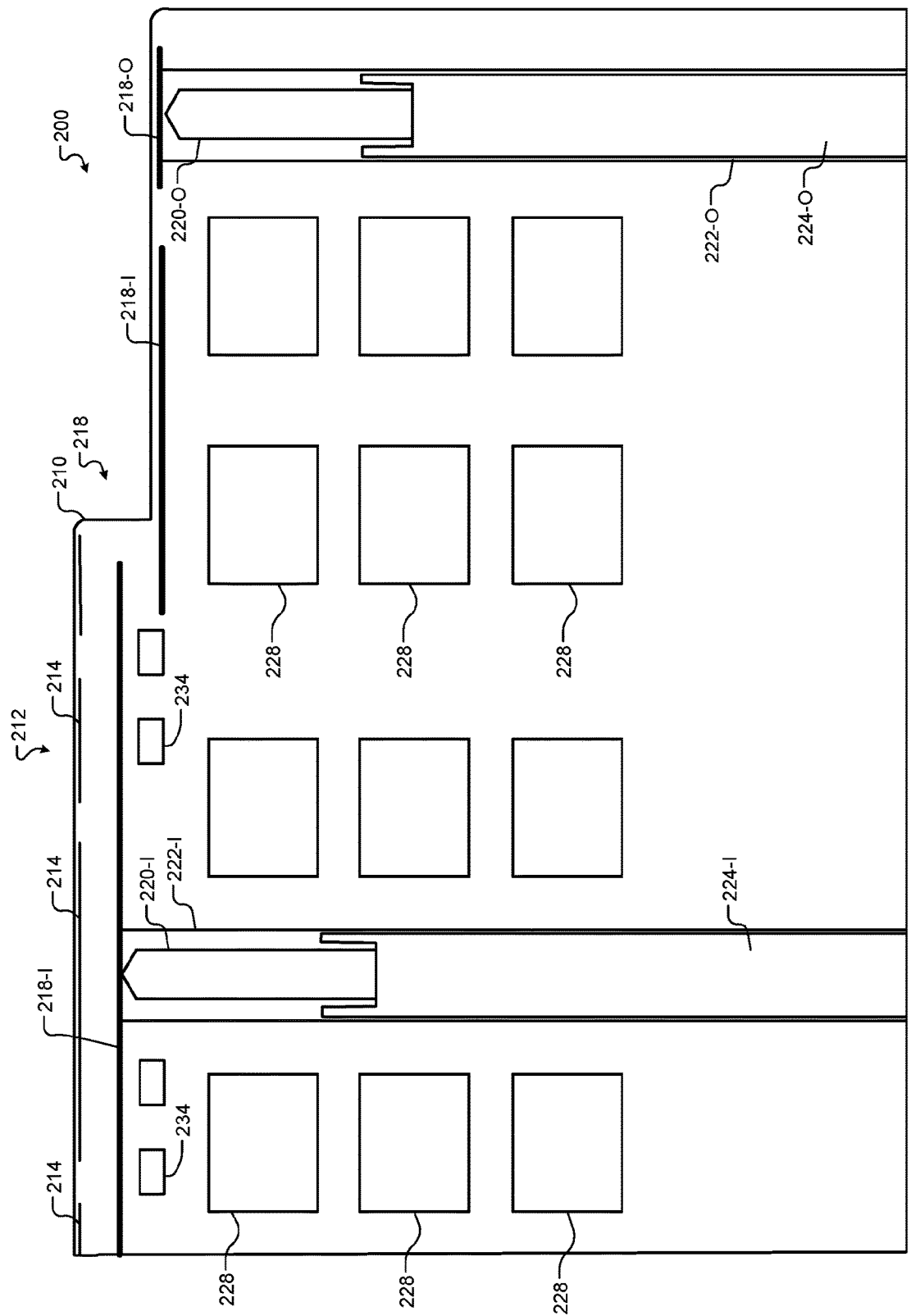
FIG. 2 is a partial side cross-sectional view of an example of an ESC incorporating coolant channels, back side gas channels, electrodes, and RF terminals according to the present disclosure.

Referring now also to FIG. 2, a portion 200 of the ESC 101 is shown. The ESC 101 has a monolithic body 210. In the example shown, the monolithic body 210 includes electrostatic clamping electrodes 214 that are arranged adjacent to a top surface 212 of the ESC 101. The electrostatic clamping electrodes 214 receive the clamping signal from the ESC power supply 180 to clamp the substrate 107. The electrostatic clamping electrodes 214 may be connected to terminals (shown below), which may be connected to the ESC power supply 180. For example, a conductor passes through an insulated cavity to provide a connection to the electrostatic clamping electrode 214.

The monolithic body 210 further includes inner and outer radio frequency (RF) electrodes 218-I and 218-O (collectively RF electrodes 218), respectively. The RF electrodes 218 receive power from terminals 220-I and 220-O (collectively terminals 220), which may be connected to the bias RF matching network 129. The terminals 220 are arranged in insulated cavities 222-I and 222-O that extend from a bottom of the ESC 101 to the RF electrodes 218. The RF electrodes 218 are arranged within a predetermined distance of a top surface of the monolithic body 210. The RF electrodes 218 may be disposed in different patterns across the top surface of the monolithic body 210. One or more of the RF electrodes 218-I may be disposed in an upper portion 221 of the monolithic body 210 that protrudes upwardly and defines an annular slot. One or more of the RF electrodes 218-O may be disposed near an outer periphery of the monolithic body 210. In some examples, the RF electrodes 218-O may be disposed below an edge ring (not shown) that is located in the annular slot and centered by the portion 221.

The monolithic body 210 also includes gas channels 234 that receive back side gas (such as helium) to a back side of the substrate 107. The coolant channels 228 are arranged in one or more planes parallel to the substrate 107. The coolant channels 228 may be bifilar or a single filar.

Figure 3:
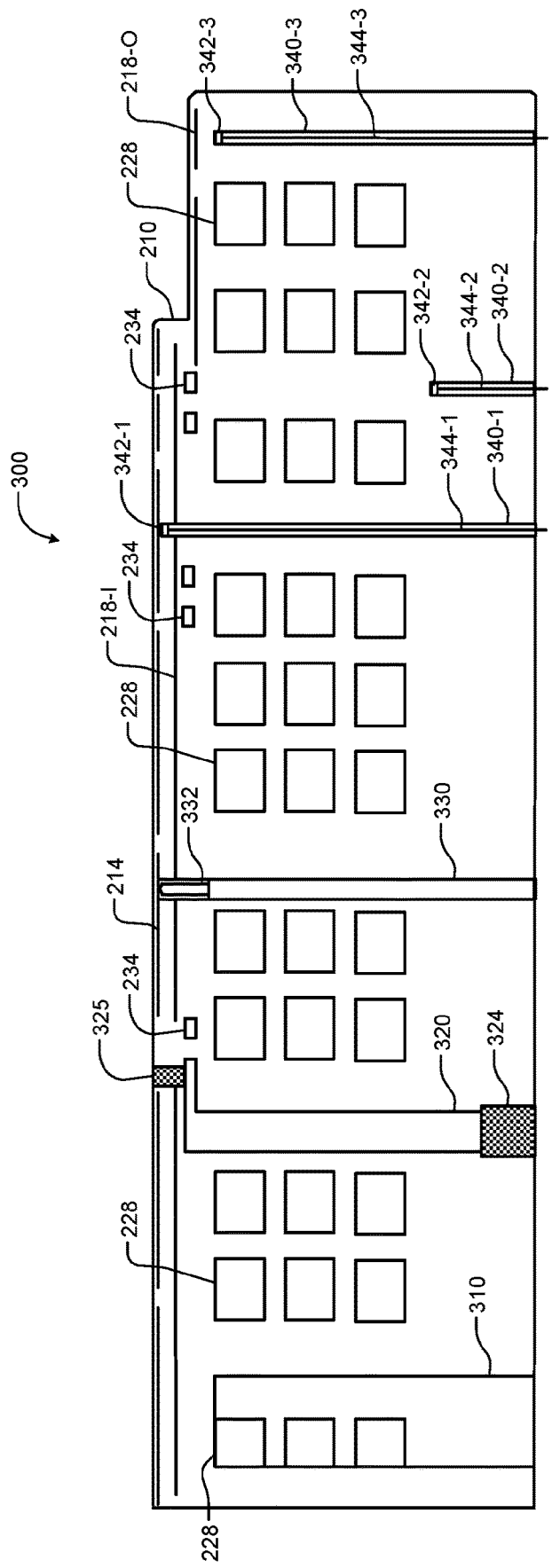
FIG. 3 is another partial side cross-sectional view of an example of an ESC incorporating a gas channel with porous plugs, sensors, and an electrostatic terminal according to the present disclosure.

Referring now to FIG. 3, a portion 300 of the ESC 101 is shown. One or more vertical inlets (or outlets) 310 provide fluid to the coolant channels 228. The monolithic body 210 includes a vertical gas channel 320 supplying back side gas to the gas channels 234. A porous plug 324 is arranged in one end of the vertical gas channel 320 adjacent to a bottom surface of the monolithic body 210. A porous plug 325 is arranged between the gas channels 234 and the top surface of the ESC 101. The porous plugs 324, 325 are made of porous ceramic and may be fired when the ceramic green sheets forming the monolithic body are fired. In some examples, the porous plugs are omitted, or installed after the firing of the monolithic body. The porous plugs include small pores to prevent formation of plasma in the gas channels to prevent line of sight to the plasma.

The monolithic body 210 includes a vertical cavity 330 housing a terminal 332 connected to one end of the electrostatic clamping electrodes 214. The monolithic body 210 further includes one or more vertical cavities for temperature sensors. Example temperature sensors 342-1, 342-2, and 342-3 (collectively temperature sensors 342) are arranged in vertical cavities 340-1, 340-2, and 340-3 and are connected to conductors 344-1, 344-2, and 344-3, respectively. The temperature sensors 342 provide temperature output signals to the controllers 142, 160.

Figure 4:
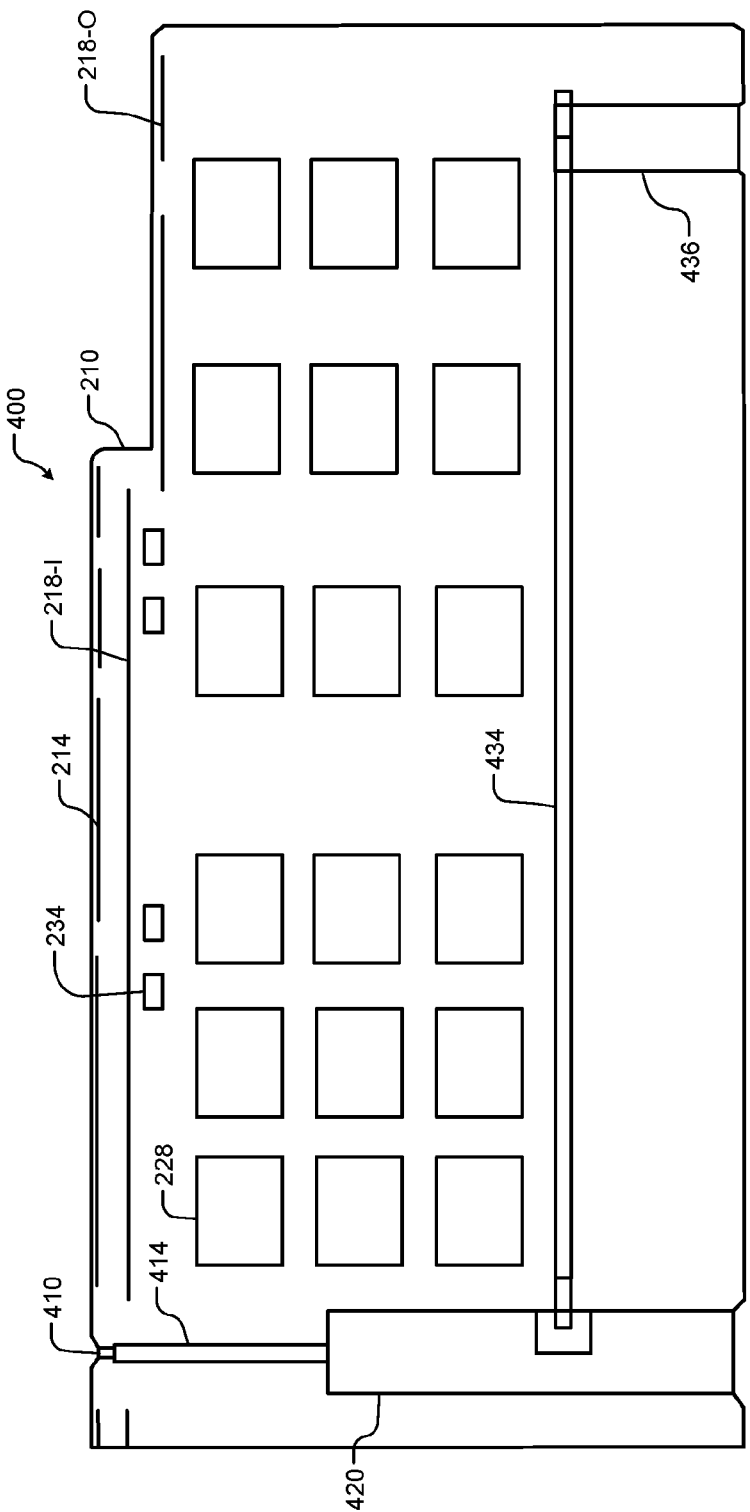
FIG. 4 is another partial side cross-sectional view of an example of an ESC with a lift pin assembly according to the present disclosure.

Referring now to FIG. 4, a portion 400 of the ESC 101 is shown. The monolithic body 210 comprises a lift pin assembly 420 including a lift pin 410, a lift pin channel 414, and a gas channel 434. In some examples, the ESC 101 includes three or more lift pin assemblies.

Figure 5:
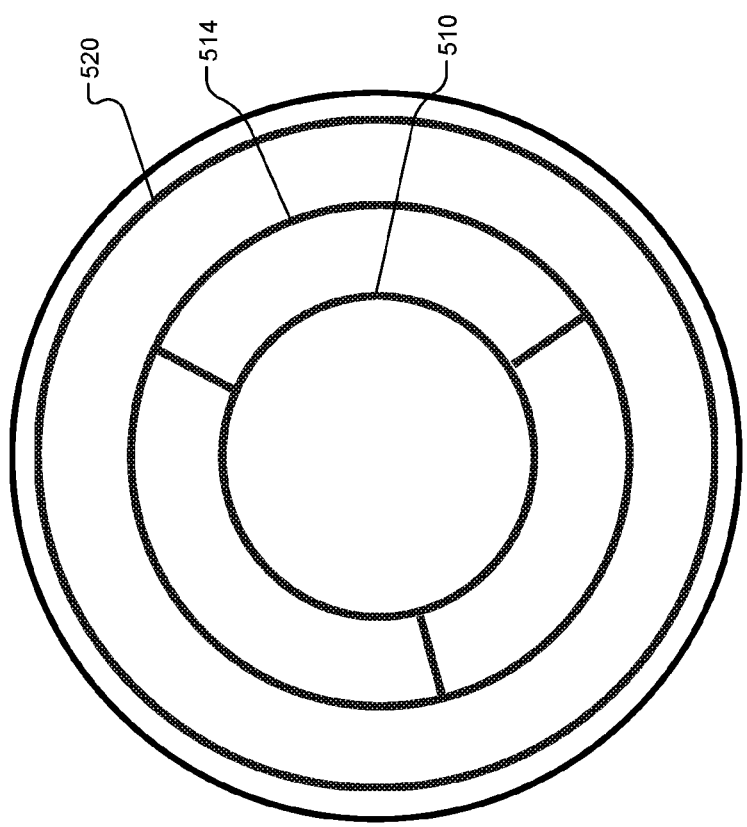
FIG. 5 is a plan view of an example of an ESC with gas channels for distributing back side gas according to the present disclosure.

Referring now to FIG. 5, the ESC 101 includes the gas channels 234 for supplying back side gas to a top surface of the monolithic body. Gas is supplied below the substrate 107 to the gas channels 234. Gas flows at various locations from the gas channels 234 through the porous plugs 325 (not shown in FIG. 5) to supply the back side gas below the substrate.

Figure 6:
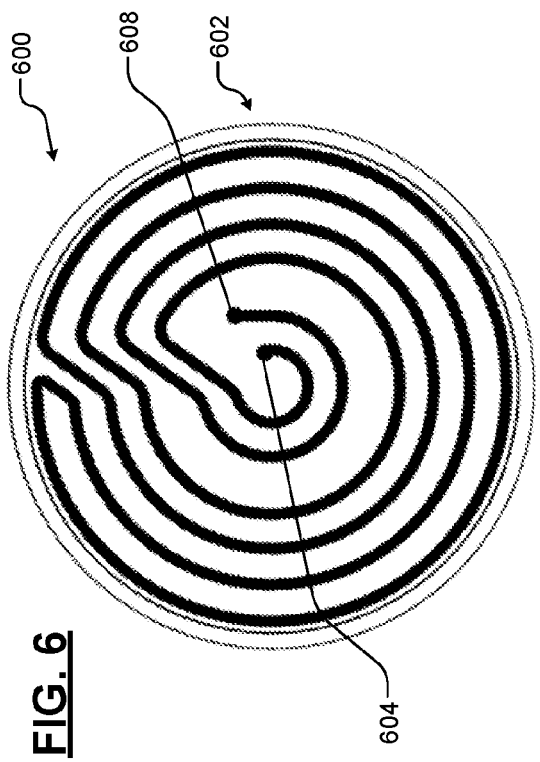
FIG. 6 is a plan view of an example of an ESC with a bifilar coolant channel formed in the ceramic monolithic body according to the present disclosure.

Referring now to FIG. 6, a coolant channel layer 600 formed in the monolithic body of the ESC 101 is shown. The coolant channel layer 600 includes a coolant channel 602 that is bifilar. The coolant channel 602 includes an inlet 604 and an outlet 608 that are centrally located in the coolant channel layer 600. One end of the coolant channel 602 starts near a center and wraps in a circular coil-like pattern until reaching a periphery. The coolant channel 602 continues in a coil-like pattern back from the periphery to the center.

Figure 7:
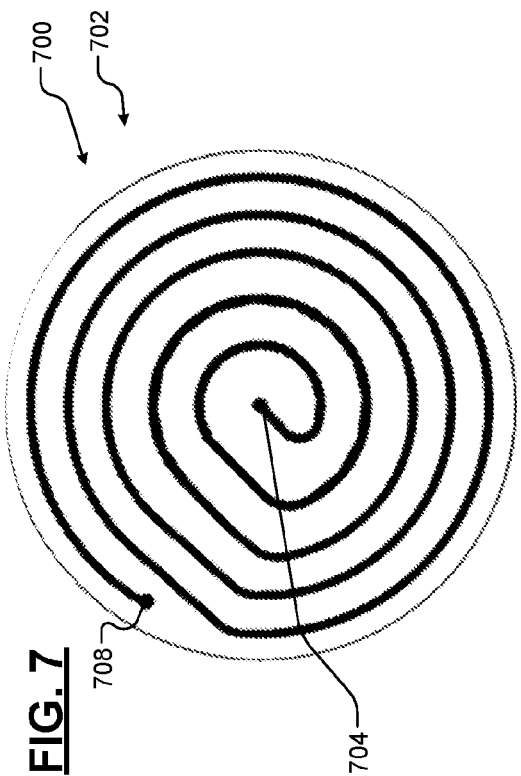
FIG. 7 is a plan view of an example of an ESC with a single filar coolant channel formed in the ceramic monolithic body according to the present disclosure.

Referring now to FIG. 7, a coolant channel layer 700 formed in the monolithic body of the ESC 101 is shown. The coolant channel layer 700 includes a coolant channel 702 in a single filar arrangement. The coolant channel 702 includes an inlet 704 that is centrally located and an outlet 708 that is located near a periphery of the coolant channel layer 700 (or vice versa). While example coolant channel arrangements are shown in FIGS. 6-7, other arrangements can be used.

Referring now to FIGS. 8A and 8B, an ESC body stack 800 can be fabricated from ceramic green sheets. In FIG. 8A, the ESC body stack 800 is shown before heating and includes a stack 802 of ceramic green sheets 806. Features such as holes, cavities (e.g. for gas channels, coolant channels, terminals, lift pins) and electrodes are formed in the ceramic green sheets as needed. More porous ceramic green sheets may be used to define porous plugs in the gas channels. In FIG. 8B, the ESC body stack 800 is shown after heating. Among other advantages, the ESC body stack 800 forms a monolithic body (features are not shown) after heating. The monolithic body has improved electrical and thermal characteristics and does not include or require a bonding layer that can cause early failures.

Referring now to FIG. 9, a method 900 for fabricating the monolithic body of the ESC is shown. At 910, openings are cut in one or more of the ceramic green sheets to define features of the ESC. In some examples, the features are laser cut in the ceramic green sheets. For example, openings corresponding to cavities for gas channels, terminals, porous plugs, sensors and/or gas flow are cut into the green sheets. In some examples, a laser is used to score or ablate a top surface of the ceramic green sheets to create gas channels that are parallel to a plane including the substrate. In other examples, a laser is used to cut through one or more ceramic green sheets to create gas channels, cavities or other features that are oriented perpendicular to a plane including the substrate. In some examples, each of the green sheets has a thickness in a range from 0.5 mm to 2 mm, although other thicknesses can be used.

At 914, electrodes such as RF electrodes or electrostatic chucking electrodes are formed on selected ones of the ceramic green sheets. In some examples, the electrodes are formed by printing metal powder onto the ceramic green sheets. At 918, a porous plug material is optionally arranged in one or more features of the ceramic green sheets (such as the gas channels). In some examples, the porous plug material includes ceramic green sheet material that is different (e.g. more porous) than the green sheet material used for the ESC body. At 922, the ceramic green sheets are rotationally aligned (to align features) and arranged in contact to form a stack.

At 924, the stack is heated or fired to form a monolithic ESC body. In some examples, the ESC stack is heated to a temperature in a range from 1000° C. to 2000° C. At 926, sensors and terminals are optionally installed. At 928, one or more surfaces of the ESC body are machined as needed. The machining can be used to level surfaces of the ESC body. As can be appreciated, the ordering of one or more the steps can be changed from the preceding example.

Figure 10A:
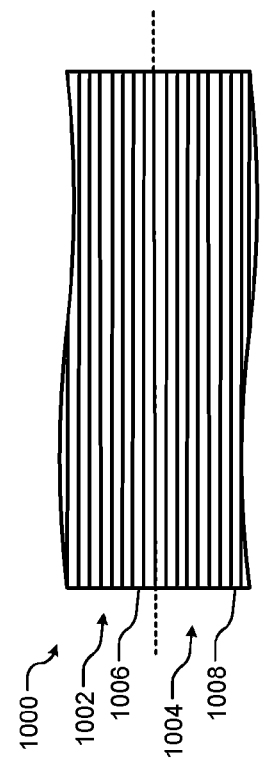
FIG. 10A illustrates an example of a body stack including a first stack of ceramic green sheets having a first quality and a second stack of ceramic green sheets having a second quality before heating according to the present disclosure.
Figure 10B:
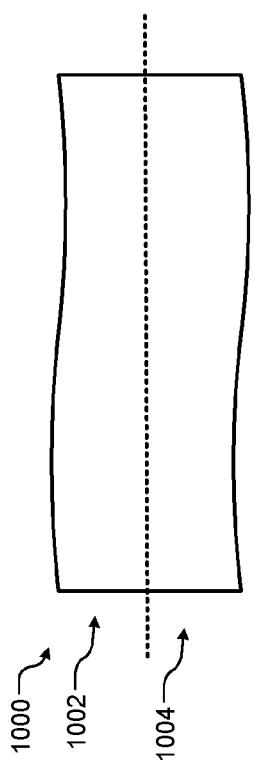
FIG. 10B illustrates the body stack of FIG. 10A after heating according to the present disclosure.

Referring now to FIGS. 10A and 10B, an ESC body stack 1000 can be fabricated from ceramic green sheets. In some examples, the ceramic green sheets have different quality depending upon their location in the ESC 101. Higher quality ceramic green sheets are used near the substrate and lower quality ceramic green sheets are used in lower or less critical portions of the ESC 101. In FIG. 10A, the ESC body stack 1000 is shown before heating and includes a first stack 1002 of ceramic green sheets 1006 having a first quality. The ESC body stack 1000 also includes a second stack 1004 of ceramic green sheets 1008 having a second quality. In FIG. 10B, the ESC body stack 1000 is shown after heating. Among other advantages, the ESC body stack 1000 forms a monolithic body 1010 after heating. The monolithic body 1010 has improved electrical and thermal characteristics and does not include or require a bonding layer that can cause early failures.

Figure 11A:
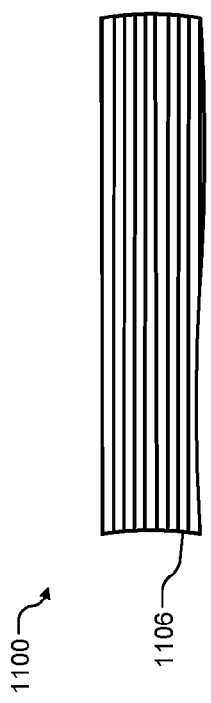
FIG. 11A illustrates an example of a body stack including a first stack of ceramic green sheets corresponding to a lower portion of the ESC before heating according to the present disclosure.
Figure 11B:
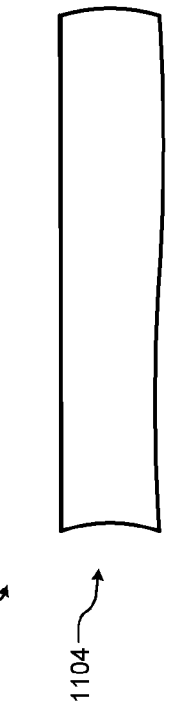
FIG. 11B illustrates the body stack of FIG. 11A after heating according to the present disclosure.
Figure 11C:
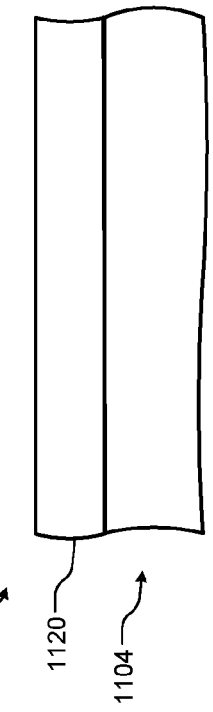
FIG. 11C illustrates the body stack of FIG. 11B after deposition of the upper portion of the ESC according to the present disclosure.

Referring now to FIGS. 11A to 11C, an ESC body 1100 can be formed by a combination of ceramic green sheets that are fired and optionally machined. Then, an upper portion of the monolithic body is formed by deposition of additional materials such as ceramic and conductive material forming electrodes. Vias or holes may be defined to allow placement of sensors such as temperature sensors, lift pin assemblies, terminals for RF electrodes, gas channels, etc.

In FIG. 11A, an ESC body stack 1100 includes a stack of ceramic green sheets 1106. In FIG. 11B, the ESC body stack 1100 is shown after heating, of the ceramic green sheets into a monolithic body 1104. In FIG. 11C, the ESC body stack 1100 of FIG. 11B is shown after deposition of one or more ceramic materials and one or more conductive materials (e.g. to define electrodes) (both layers are collectively identified at 1120) in an upper portion of the ESC 101. In some examples, machining is performed on an upper surface of the ESC 101 to provide a planar surface before deposition.

Figure 12:
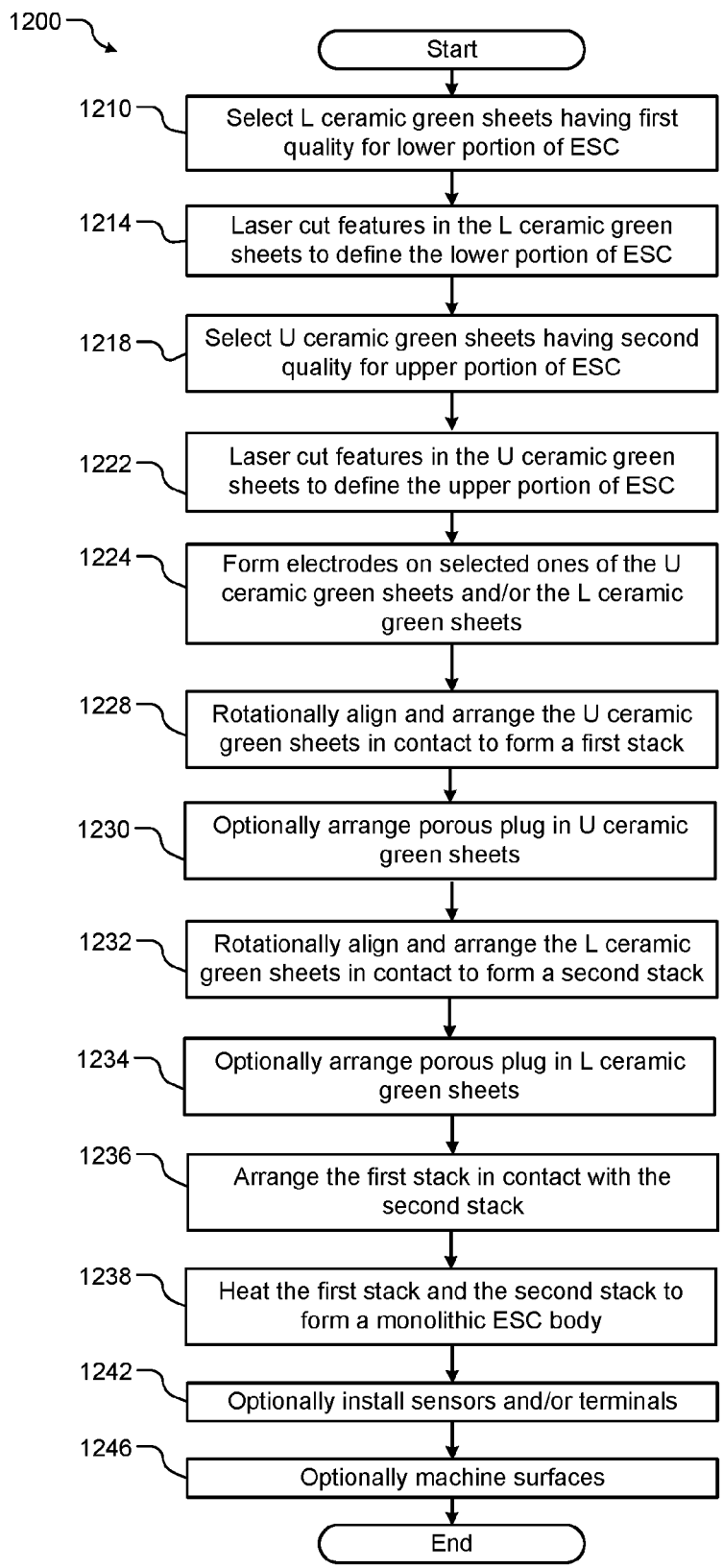
FIG. 12 is a flowchart of a method for fabricating the ESC with a ceramic monolithic body according to the present disclosure.

Referring now to FIG. 12, a method 1200 for fabricating the monolithic body of the ESC is shown. At 1210, L ceramic green sheets having a first quality are selected for a lower portion of the ESC body, where L is an integer greater than one. At 1214, openings are cut in one or more of the L ceramic green sheets to define features of the lower portion of the ESC. In some examples, the features are laser cut in the ceramic green sheets. For example, openings corresponding to cavities for gas channels, terminals, porous plugs, sensors and/or gas flow are cut into the green sheets. In some examples, a laser is used to score or ablate a top surface of the ceramic green sheets to create gas channels that are parallel to a plane including the substrate. In other examples, a laser is used to cut through one or more ceramic green sheets to create gas channels, cavities or other features that are oriented perpendicular to a plane including the substrate. In some examples, each of the green sheets has a thickness in a range from 0.5 mm to 2 mm, although other thicknesses can be used.

At 1218, U ceramic green sheets having a second quality are selected for the upper portion of the ESC body, where U is an integer greater than one. In some examples, the second quality is higher than the first quality. For example, the second quality may differ from the first quality in porosity, purity, dielectric constant, loss tangent or other characteristics.

At 1222, features are cut into one or more of the U ceramic green sheets to define the upper portion of the ESC. At 1224, electrodes such as RF electrodes or electrostatic chucking electrodes are formed on selected ones of the U ceramic green sheets and/or the L ceramic green sheets. In some examples, the electrodes are formed by printing metal powder onto the ceramic green sheets.

At 1228, the L ceramic green sheets are rotationally aligned (to align features) and placed in contact to form a first stack. At 1230, a porous plug material is optionally arranged in one or more features of the L ceramic green sheets. In some examples, the porous plug material includes green sheet material that is different than the green sheet material used for the upper and lower portions of the ESC body. At 1232, the U ceramic green sheets are rotationally aligned (to align features) and arranged in contact to form a second stack. At 1232, a porous plug material is optionally arranged in features of the U ceramic green sheets.

At 1236, the first stack is arranged in contact with the second stack. At 1238, the first stack and the second stack are heated or fired to form a monolithic ESC body. In some examples, the ESC stack is heated to a temperature in a range from 1000° C. to 2000° C. At 1242, sensors and terminals are optionally installed. At 1246, one or more surfaces of the ESC body are machined as needed. The machining can be used to level surfaces of the ESC body. As can be appreciated, the ordering of one or more the steps can be changed from the preceding example.

Figure 13:
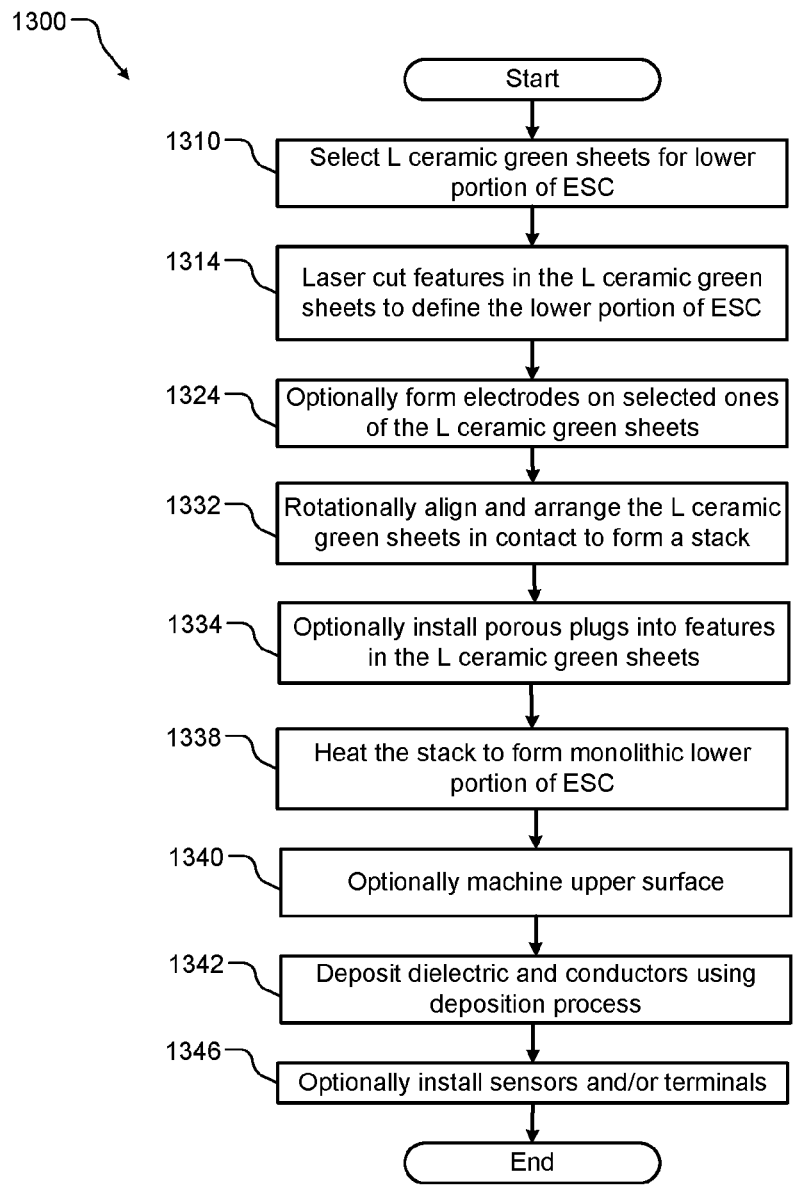
FIG. 13 is a flowchart of another method for fabricating the ESC with a ceramic monolithic body according to the present disclosure.

Referring now to FIG. 13, another method 1300 for fabricating the ESC with a monolithic body is shown. At 1310, L ceramic green sheets are selected for a lower portion of the ESC body. At 1314, features are cut into one or more of the L ceramic green sheets to define features of the lower portion of the ESC body. At 1324, electrodes are optionally formed on selected ones of the L ceramic green sheets.

At 1332, the L ceramic green sheets are arranged in contact to form a stack. At 1334, porous plug material is optionally installed into one or more features of the L ceramic green sheets. At 1338, the stack is heated to form a lower portion of the ESC body. At 1340, the upper surface of the lower portion of the ESC body is optionally machined.

At 1342, dielectric and/or conductor material is deposited. In some examples, the dielectric and/or conductor material is deposited using a deposition process such as atomic layer deposition (ALD), chemical vapor deposition (CVD), spray coating or other process. At 1346, sensors are optionally installed in one or more features of the ESC body. In some examples, multiple process steps including photolithography, deposition of dielectric material, conductive material and/or masking material, and/or etching are performed to define the RF or electrostatic chucking terminals and surrounding dielectric material. As can be appreciated, the quality of dielectric material in the upper portion of the ESC body can be higher than the ceramic green sheets used for lower portions of the ESC body.

In some examples, the ESC with the monolithic body can be used for higher power applications. Prior designs including the separate ceramic plate, metal body and bonding layer were limited to 10 kW to 20 kW whereas the ESC with the monolithic body can be used from 10 kW to 50 kW and higher power levels. As can be appreciated, use of higher power allows higher etch rates.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An electrostatic chuck for a substrate processing system, comprising:
    a monolithic body made of ceramic:
    a plurality of first electrodes that are arranged in the monolithic body adjacent to a top surface of the monolithic body and that are configured to selectively receive a chucking signal;
    a gas channel formed in the monolithic body and configured to supply back side gas to the top surface; and
    a plurality of coolant channels formed in the monolithic body and configured to receive fluid to control a temperature of the monolithic body.

2. The electrostatic chuck of claim 1, wherein the monolithic body comprises a plurality of ceramic green sheets.

3. The electrostatic chuck of claim 1, wherein the monolithic body comprises a first portion arranged adjacent to a substrate and a second portion located adjacent to the first portion, wherein the first portion is made of a first plurality of ceramic green sheets having a first quality and the second portion is made of a second plurality of ceramic green sheets having a second qualify that is different from the first quality.

4. The electrostatic chuck of claim 3, wherein the second plurality of ceramic green sheets have at least one of increased porosity, reduced purity, an increased dielectric constant or an increased loss tangent relative to the first plurality of ceramic green sheets.

5. The electrostatic chuck of claim 1, wherein the plurality of first electrodes are arranged between the plurality of coolant channels and the top surface.

6. The electrostatic chuck of claim 1, further comprising a plurality of second electrodes that are arranged in the monolithic body and that are configured to receive an RF bias signal.

7. The electrostatic chuck of claim 6, wherein the plurality of second electrodes are arranged between the plurality of coolant channels and the plurality of first electrodes.

8. The electrostatic chuck of claim 1, further comprising a porous plug arranged in at least one of an inlet and an outlet of the gas channel.

9. The electrostatic chuck of claim 1, wherein:
    the monolithic body comprises a first portion arranged adjacent to a substrate and a second portion arranged adjacent to the first portion;
    the second portion is made of a plurality of ceramic green sheets; and
    the first portion is deposited on the second portion and includes a plurality of ceramic layers and a conducting layer defining the plurality of first electrodes.

10. The electrostatic chuck of claim 9, wherein the first portion is deposited using a process selected from a group consisting of atomic layer deposition and chemical vapor deposition.

11. The electrostatic chuck of claim 1, wherein the monolithic body defines a lift pin cavity and further comprising a lift pin assembly arranged in the lift pin cavity.

12. The electrostatic chuck of claim 1, wherein:
    the monolithic body comprises an upward protruding portion extend upward from a base portion; and
    the upward protruding portion has a smaller outer diameter than the base portion.

13. The electrostatic chuck of claim 12, wherein:
    the upward protruding portion comprises the plurality of first electrodes and a first radio frequency (RF) electrode; and
    the base portion comprises a second RF electrode.

14. The electrostatic chuck of claim 12, wherein:
    the upward protruding portion comprises at least a portion of the gas channel; and
    the base portion comprises the plurality of coolant channels.

15. The electrostatic chuck of claim 12, wherein the base portion comprises a radio frequency electrode disposed radially outward of the gas channel.

16. The electrostatic chuck of claim 12, wherein the base portion comprises a radio frequency electrode disposed at least partially radially outward of the upward protruding portion.

17. The electrostatic chuck of claim 12, wherein one of the plurality of coolant channels is in a bifilar arrangement.

18. The electrostatic chuck of claim 12, wherein one of he plurality of coolant channels is in a single filar arrangement.

* * * * *